United States Patent
Park et al.

(10) Patent No.: US 12,523,935 B2
(45) Date of Patent: Jan. 13, 2026

(54) SUBSTRATE PROCESSING METHOD USING LOW TEMPERATURE DEVELOPER AND SEMICONDUCTOR DEVICE MANUFACTURING APPARATUS USING THE SAME

(71) Applicant: Samsung Electronics Co., Ltd., Suwon-si (KR)

(72) Inventors: Sangjine Park, Suwon-si (KR); Jihoon Jeong, Seongnam-si (KR); Younghoo Kim, Yongin-si (KR); Kuntack Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1124 days.

(21) Appl. No.: 17/488,456

(22) Filed: Sep. 29, 2021

(65) Prior Publication Data

US 2022/0326617 A1  Oct. 13, 2022

(30) Foreign Application Priority Data

Apr. 9, 2021 (KR) .......................... 10-2021-0046325

(51) Int. Cl.
*G03F 7/38* (2006.01)
*H01L 21/02* (2006.01)
*H01L 21/687* (2006.01)

(52) U.S. Cl.
CPC .......... *G03F 7/38* (2013.01); *H01L 21/02101* (2013.01); *H01L 21/68707* (2013.01)

(58) Field of Classification Search
CPC ......... G03F 7/38; G03F 7/32; H01L 21/02101
See application file for complete search history.

(56) References Cited

U.S. PATENT DOCUMENTS

| | | | |
|---|---|---|---|
| 5,571,644 A * | 11/1996 | Uraguchi | G03F 7/3021 430/326 |
| 5,678,116 A | 10/1997 | Sugimoto et al. | |
| 6,033,475 A | 3/2000 | Hasebe et al. | |
| 6,328,905 B1 | 12/2001 | Lebowitz et al. | |
| 2002/0132184 A1 | 9/2002 | Babcock | |
| 2004/0072108 A1 | 4/2004 | Hyon | |
| 2005/0079451 A1 | 4/2005 | Doan et al. | |
| 2008/0004194 A1 | 1/2008 | Mcdermott et al. | |
| 2019/0025703 A1 * | 1/2019 | Shimizu | B65D 85/70 |
| 2020/0026194 A1 * | 1/2020 | Choi | G03F 7/325 |

FOREIGN PATENT DOCUMENTS

KR   960024699 A   7/1996

* cited by examiner

*Primary Examiner* — Daborah Chacko-Davis
(74) *Attorney, Agent, or Firm* — Wolf, Greenfield & Sacks, P.C.

(57) ABSTRACT

A substrate processing method includes supplying a first developer at a first temperature onto a substrate in a development device, thereby performing a development process, supplying a process fluid at a second temperature lower than the first temperature onto the substrate, thereby replacing a residue of the first developer remaining after the development process with a second developer, transferring the substrate from the development device to a supercritical drying device, and supplying, by the supercritical drying device, at least one of a supercritical fluid and a subcritical fluid onto the substrate, thereby drying the second developer.

12 Claims, 12 Drawing Sheets

SUBSTRATE PROCESSING METHOD USING LOW TEMPERATURE DEVELOPER AND SEMICONDUCTOR DEVICE MANUFACTURING APPARATUS USING THE SAME

CROSS-REFERENCE TO THE RELATED APPLICATION

This application claims priority from Korean Patent Application No. 10-2021-0046325, filed on Apr. 9, 2021, in the Korean Intellectual Property Office, the disclosure of which is incorporated herein by reference in its entirety.

FIELD

The example embodiments of the disclosure relate to a substrate processing method using a low temperature developer and a semiconductor device manufacturing apparatus using the same.

BACKGROUND

Recently, introduction of a photolithography process using extreme ultraviolet (EUV) light has been gradually increased, and realization of a finer pattern in a semiconductor device has been achieved. As patterns become finer, and the critical dimension of the patterns is reduced, a phenomenon in which the patterns collapse may occur in the existing drying method in which, after conduction of a development process using a developer, a substrate is rotated at a high speed to dry the developer. Such a phenomenon occurs because an attractive force exerted between patterns during drying due to influence of surface tension of the developer. To this end, a supercritical drying process using a supercritical fluid having little surface tension has recently been substituted for the existing drying process.

SUMMARY

The example embodiments of the disclosure provide a substrate processing method and a semiconductor device manufacturing apparatus capable of preventing dissolution of a photoresist pattern during transfer of a substrate.

A substrate processing method according to an example embodiment of the disclosure includes supplying a first developer at a first temperature onto a substrate in a development device, thereby performing a development process, supplying a process fluid at a second temperature lower than the first temperature onto the substrate, thereby replacing a residue of the first developer remaining after the development process with a second developer, transferring the substrate from the development device to a supercritical drying device, and supplying, by the supercritical drying device, at least one of a supercritical fluid and a subcritical fluid onto the substrate, thereby drying the second developer.

A semiconductor device manufacturing apparatus according to an example embodiment of the disclosure includes a development device configured to perform a development process for an exposed photoresist layer on a substrate, a supercritical drying device configured to dry the substrate using at least one of a supercritical fluid and a subcritical fluid, and a transfer robot configured to transfer the substrate from the development device to the supercritical drying device. The development device includes a chamber configured to receive the substrate, a first tank configured to store a first developer at a first temperature, a second tank configured to store a second developer at a second temperature lower than the first temperature, a first fluid supplier interconnecting the first tank and the chamber, and a second fluid supplier interconnecting the second tank and the chamber.

A semiconductor device manufacturing apparatus according to an example embodiment of the disclosure includes a development device configured to perform a development process for an exposed photoresist layer on a substrate, a supercritical drying device configured to dry the substrate through supply of at least one of a supercritical fluid and a subcritical fluid, and a transfer robot configured to transfer the substrate from the development device to the supercritical drying device. The development device includes a chamber configured to receive the substrate, a first source storage configured to store a first developer, a second source storage configured to store pressurized $CO_2$, a first tank configured to store the first developer at a first temperature, a second tank configured to store a second developer at a second temperature, a first source supplier interconnecting the first source storage and the first tank and configured to supply the first developer to the first tank; a second source supplier interconnecting the second source storage and the second tank and configured to supply the pressurized $CO_2$ to the second tank, an intermediate supplier interconnecting the first tank and the second tank and configured to supply the first developer to the second tank, and a fluid supplier interconnecting the second tank and the chamber and configured to supply the second developer to the chamber.

DETAILED DESCRIPTION OF EMBODIMENTS

Figure 1A:
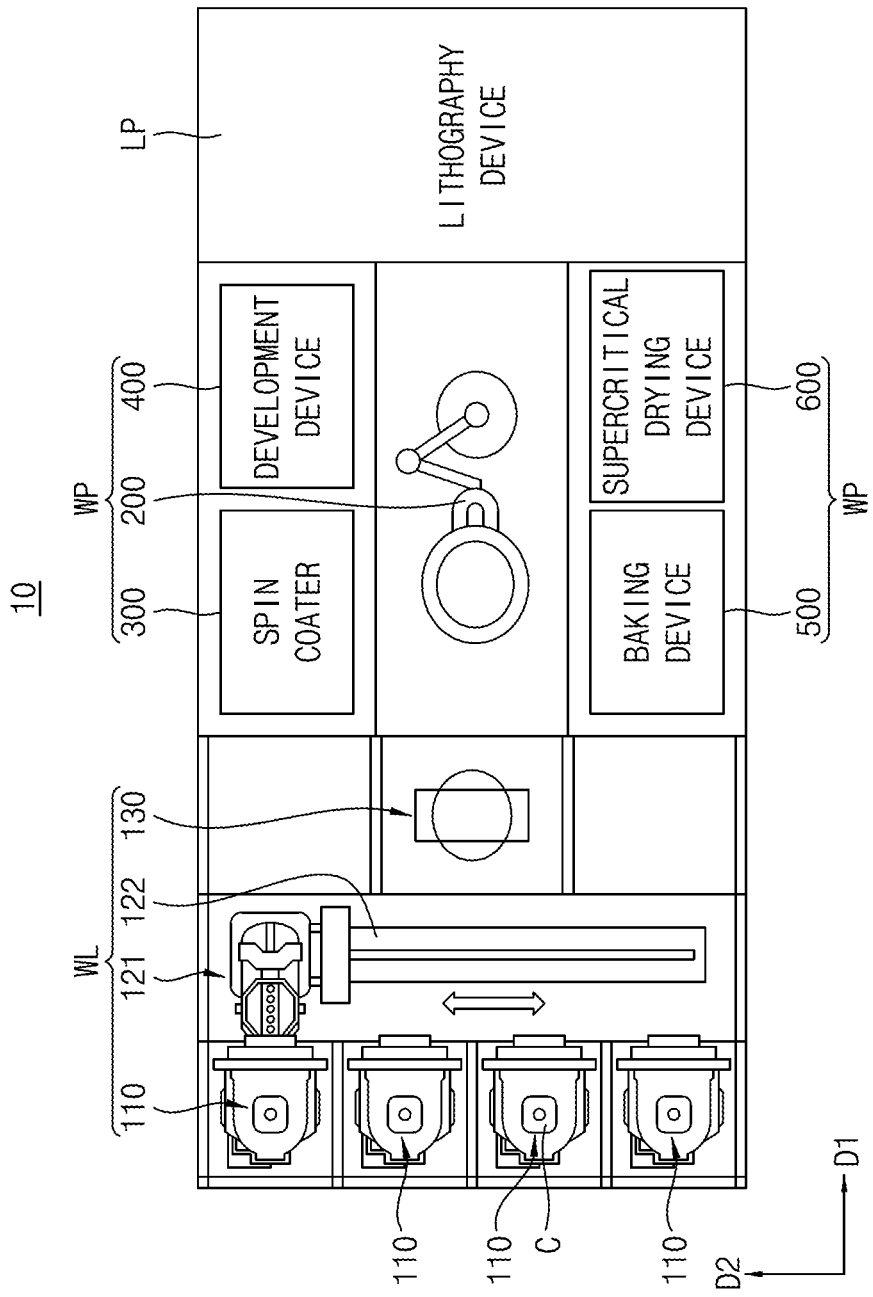
FIG. 1A is a block diagram explaining a semiconductor device manufacturing apparatus according to an example embodiment of the disclosure.
Figure 1B:
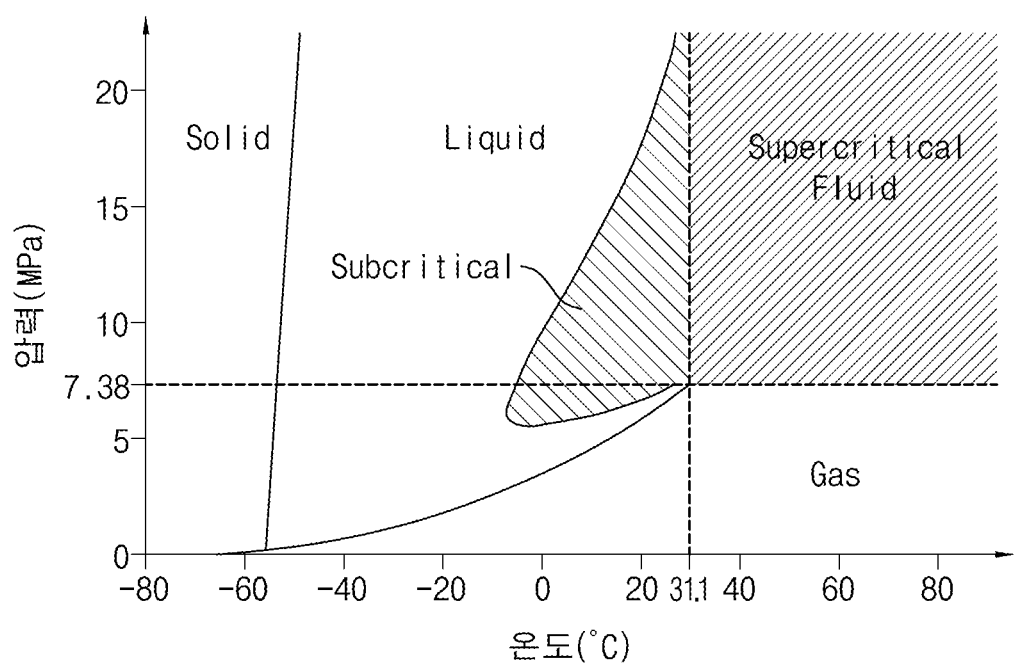
FIG. 1B is a phase diagram of carbon dioxide.

FIG. 1A is a block diagram explaining a semiconductor device manufacturing apparatus according to an example embodiment of the disclosure. FIG. 1B is a phase diagram of carbon dioxide.

Referring to FIG. 1A, a semiconductor device manufacturing apparatus 10 may include a substrate loader WL, a substrate processing device WP, and a lithography device LP. The substrate loader WL, the substrate processing device WP, and the lithography device LP may be aligned with one another in a first direction D1. The substrate processing device WP may be disposed between the substrate loader WL and the lithography device LP. Of course, arrangement relation of the devices shown in FIG. 1A is only illustrative and, as such, the example embodiments of the disclosure are not limited thereto.

The substrate loader WL may include one or more loading ports 110, an index robot 121, a transfer rail 122, and a buffer 130. The loading port 110 may be disposed at one side of the index robot 121 and the transfer rail 122. The loading port 110 may be arranged such that a plurality of loading ports 110 are aligned with one another. The loading port 110 may include a carrier C capable of receiving a substrate. The carrier C may be loaded in the loading port 110 after being transferred from outside the semiconductor device manufacturing apparatus 10, or may be transferred to the outside after being unloaded from the loading port 110.

The index robot 121 may move along the transfer rail 122. The transfer rail 122 may be disposed to extend in a second direction D2 perpendicularly intersecting the first direction D1. The transfer rail 122 may provide a path along which the index robot 121 moves. The index robot 121 may transfer a substrate received in the carrier C to the buffer 130. Otherwise, the index robot 121 may unload a substrate from the buffer 130, and may then load the substrate into the carrier C.

The buffer 130 may be disposed between the transfer rail 122 and a transfer robot 200. The buffer 130 may be aligned with the transfer robot 200 in the first direction D1. The buffer 130 may provide a buffer space in which a substrate transferred between the index robot 121 and the substrate processing device WP stays temporarily. At least one buffer slot, in which a substrate is received, may be provided in an interior of the buffer 130. In the buffer slot, a substrate unloaded from the carrier C by the index robot 121 may be disposed, or a substrate unloaded from the substrate processing device WP by the transfer robot 200 may be disposed.

The substrate processing device WP may include a plurality of devices for performing a series of processes for substrates. The substrate processing device WP may include the transfer robot 200, a spin coater 300, a development device 400, a baking device 500, and a supercritical drying device 600. Although not shown, in an embodiment, the substrate processing device WP may further include an etching device.

The transfer robot 200 may unload substrates from the buffer 130, and may transfer the substrates to at least one of the spin coater 300, the development device 400, the baking device 500 and the supercritical drying device 600. The transfer robot 200 may transfer, to the lithography device LP, a substrate subjected to a series of processes for exposure. The transfer robot 200 may unload a substrate subjected to an exposure process from the lithography device LP, and may transfer the unloaded substrate to, for example, the development device 400 or the baking device 500. Although the transfer robot 200 is shown as including a robot arm, the example embodiments of the disclosure are not limited thereto, and the transfer robot 200 may include other means capable of moving a substrate, such as a conveyor belt, a transfer rail, or the like.

The spin coater 300 may coat a coating material on a substrate, thereby forming a coating layer. For example, the coating layer may include a photoresist layer. For example, the photoresist layer may include chemically amplified resists. For example, the coating layer may include, in addition to the photoresist layer, an organic planarization layer and an anti-reflective coating layer disposed under the photoresist layer, an upper coating layer disposed on the photoresist layer, and one of combinations thereof.

The development device 400 may perform a development process for a substrate completely subjected to an exposure process by the lithography device LP. The development process may be a process for removing an exposed portion or an unexposed portion of the coating layer. The development process may include spraying a developer onto a substrate, and spinning the substrate, thereby uniformly coating the developer over the entire surface of the substrate. Through the development process, the exposed portion or the unexposed portion of the coating layer may be removed. For example, the developer may include an acetate series material, an organic solvent of alkanes and/or an organic solvent of ketones.

The baking device 500 may perform a soft bake process, a post-exposure bake process, and a hard bake process. The soft bake process may also refer to as "pre-bake", and may be performed after a coating layer is formed on a substrate by a spin coater. The soft bake process may be a process for removing an organic solvent remaining on a coating layer (for example, a photoresist layer), and reinforcing bonding between the coating layer and a wafer. The soft bake process may be performed at a relatively low temperature.

The post-exposure bake process may be a process for planarizing irregularities formed on a surface of a photoresist layer due to non-uniformity of intensity of light caused by stationary waves generated during exposure. The post-exposure bake process may activate a photoactive compound (PAC) included in the photoresist layer and, as such, the irregularities formed on the photoresist layer may be reduced.

The hard bake process may be a process for curing the photoresist after execution of the exposure and development processes, thereby enhancing durability of the photoresist against etching and enhancing bonding force of the photoresist to the substrate. The hard bake process may be performed at a relatively high temperature, as compared to the soft bake process.

The supercritical drying device 600 may dry a substrate. The supercritical drying device 600 may be configured to dry a substrate using a supercritical fluid. The supercritical drying device 600 may completely dry a substrate in a wet state, using low viscosity and surface tension of the supercritical fluid. The supercritical fluid may be a process fluid in a supercritical state. Here, the supercritical state means a state in which a material reaches a state exceeding a critical temperature and a critical pressure, that is, a critical state, and, as such, liquid and gas phases of the substance cannot be distinguished from each other. A material in a supercritical state has a property similar to liquids in terms of molecular density, but has a property similar to gases in terms of viscosity. A material in a supercritical state is advantageous in terms of chemical reaction because diffusibility, penetration ability and solubility thereof are very high. In addition, a material in a supercritical state does not apply interface tension to a microstructure because the surface tension thereof is very low and, as such, a dried yield in a drying process for a semiconductor device may be superior, and watermark prevention and/or collapse prevention may be achieved. A process fluid in a supercritical state may include carbon dioxide ($CO_2$), water ($H_2O$), methane ($CH_4$), ethane ($C_2H_6$), prophane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), or a combination thereof. Referring to FIG. 1B, for example, carbon dioxide may be in a supercritical state when the temperature thereof is 31.1° C. or more, and the pressure thereof is 7.38 MPa or more.

In an embodiment, the supercritical drying device 600 may dry a substrate using a subcritical fluid. The subcritical fluid is a process fluid in a subcritical state, and may mean a process fluid in a high-temperature and high-pressure state before reaching a critical temperature and a critical pressure (cf. FIG. 1B). For example, carbon dioxide may be in a subcritical state in a predetermined region in which the temperature of carbon dioxide is less than 31.1° C., but approximates to 31.1° C., and/or the pressure of carbon dioxide is less than 7.38 MPa, but approximates to 7.38 MPa. The supercritical drying device 600 may dry a substrate by supplying at least one of a supercritical fluid and a subcritical fluid onto the substrate. In an embodiment, the supercritical drying device 600 may dry a substrate using a gas in a gaseous state as well as a supercritical fluid and a subcritical fluid.

In an embodiment, the substrate processing apparatus WP may further include a subcritical drying device providing a subcritical fluid in addition to the supercritical drying device 600, or may include a subcritical drying device in place of the supercritical drying device 600.

When a substrate including a residual developer remaining after execution of a development process in the development device 400 is loaded into a chamber of the supercritical drying device 600, a drying process using a supercritical fluid and/or a subcritical fluid may be performed in the chamber. The drying process may dry the residual developer on the substrate while reducing or eliminating damage to a photoresist pattern by utilizing solvent substitution through a supercritical fluid and/or a subcritical fluid.

The lithography device LP may perform a lithography process using extreme ultraviolet (EUV) radiation as a light source. That is, the lithography device LP may perform exposure using EUV radiation such that a photoresist layer coated over a substrate corresponds to a predetermined pattern image. The EUV radiation may be electromagnetic radiation having a wavelength of 2 to 50 nm, and may have, for example, a wavelength of 13 to 14 nm. Such radiation may also be referred to as "soft X-ray radiation". The EUV radiation may be generated using plasma.

The lithography device LP, which generates EUV radiation, may include a laser for exciting a fuel to provide plasma, and a source collector module for containing the plasma. For example, the plasma may be created by irradiating a fuel, such as particles of a suitable material (e.g., tin) with a laser beam or directing an appropriate flow of gas or vapor, such as Xe gas or Li vapor, to the fuel. Such a radiation device may be referred to as a "laser-produced plasma (LPP) source". Alternatively, possible sources may include discharge plasma sources, or sources based on synchrotron radiation provided by an electron storage ring.

In EUV lithography, the choice of wavelength can be limited by practical considerations involving the availability of suitable radiation sources, optical components and process materials. Current EUV lithography processes all operate using radiation wavelengths in a range of 13 to 14 nm, and there are a number of developments that must be conducted before EUV lithography can be used for mass production. EUV radiation having a wavelength of 11 nm or less may be used, for example, in a range of 5 to 10 nm or 5 to 8 nm, in particular, in a so-called '6.x' wavelength region (6.5 to 6.9 nm, for example, 6.7 to 6.8 nm). Such a short-wavelength EUV lithography process may provide better resolution (features below 11 nm node), greater depth of focus (DOF) and higher throughput, as compared to EUV lithography processes of the currently used wavelength (for example, 13.5 nm).

Figure 2:
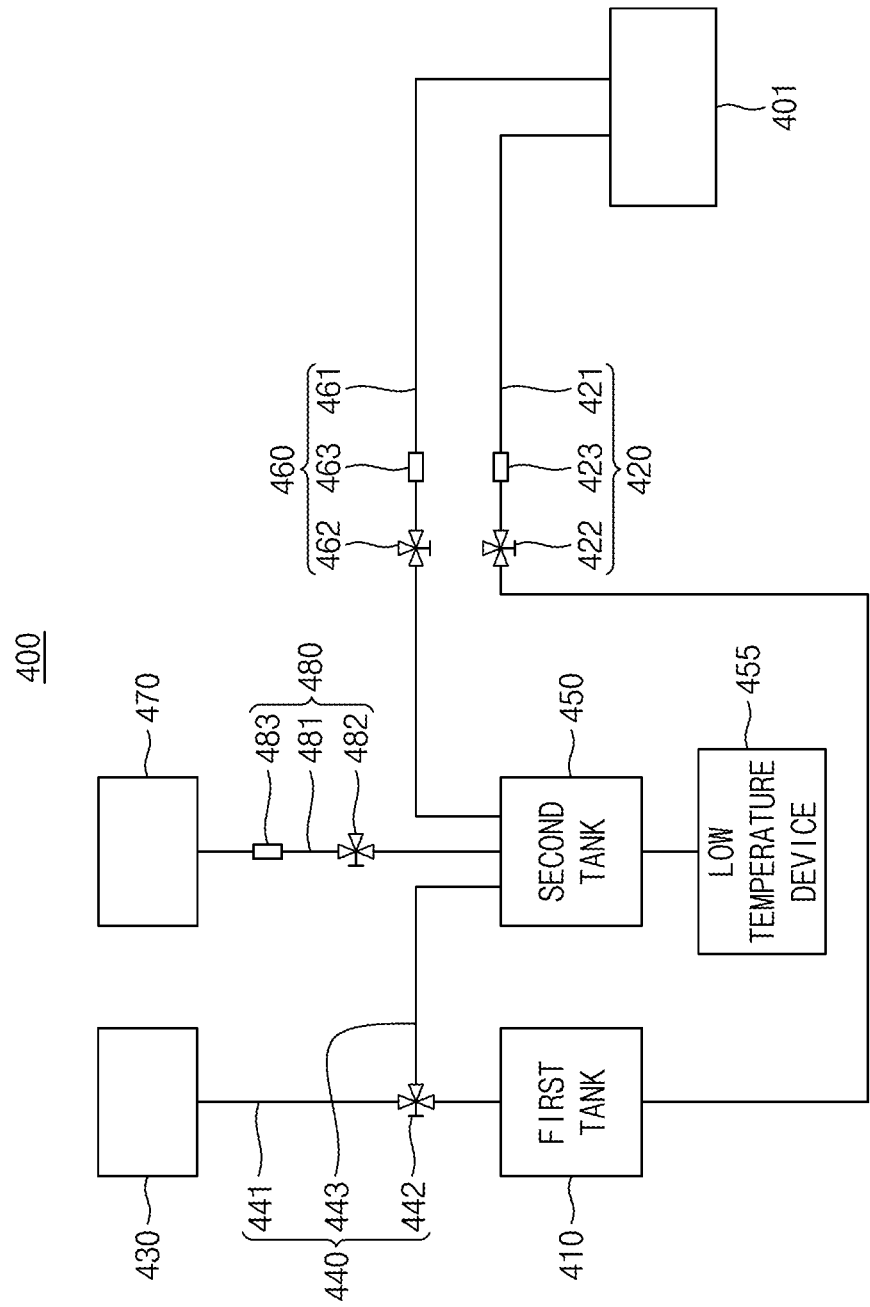
FIG. 2 is a view schematically showing a development device according to an example embodiment of the disclosure.
Figure 3:
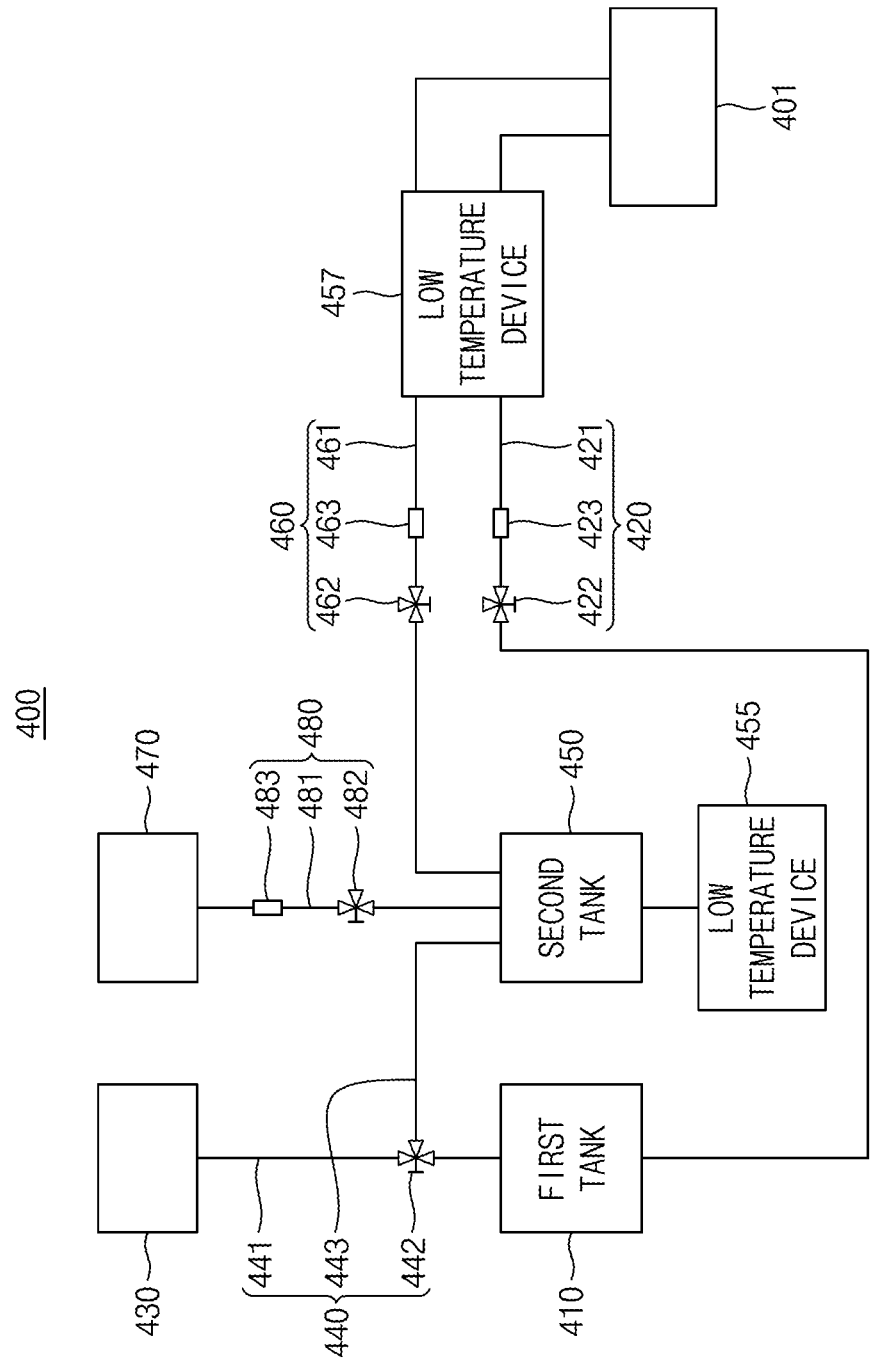
FIG. 3 is a view schematically showing a development device according to an example embodiment of the disclosure.

FIG. 2 is a view schematically showing a development device according to an example embodiment of the disclosure. FIG. 3 is a view schematically showing a development device according to an example embodiment of the disclosure.

Referring to FIGS. 1A and 2, a development device 400 may include a chamber 401, a first tank 410, a first fluid supplier 420, a first source storage 430, a first source supplier 440, a second tank 450, a second fluid supplier 460, a second source storage 470, a second source supplier 480, and a low temperature device 455.

A development process using a developer may be performed in the chamber 401. A substrate to be subjected to a development process may be provided to the chamber 401. The substrate, which is provided to the chamber 401, may include a photoresist layer subjected to an exposure process. That is, a substrate, which has been subjected to an exposure process in the lithography device LP, may be provided to the development device through the transfer robot 200.

The first tank 410 may store a first developer. The first developer may include an acetate series material, an organic solvent of alkanes and/or an organic solvent of ketones. For example, the first developer may be n-butyl acetate. The first tank 410 may store the first developer at a first temperature. For example, the first temperature may be ambient temperature, that is, about 15 to 25° C. Of course, the example embodiments of the disclosure are not limited to the above-described condition, and the first temperature may be 15° C. or less or 25° C. or more in accordance with the kind of the first developer. The first tank 410 may be connected to the chamber 401 via the first fluid supplier 420. The first developer stored in the first tank 410 may be provided onto a substrate in the chamber 401 through the first fluid supplier 420. The first fluid supplier 420 may include a first supply line 421, a first supply valve 422, and a first supply filter 423. The first supply line 421 may interconnect the first tank 410 and the chamber 401, and the first supply valve 422 and the first supply filter 423 may be provided at the first supply line 421. The first supply valve 422 may open or close the first supply line 421, thereby adjusting a flow rate of the first developer. The first supply filter 423 may remove impurities from the first developer passing through the first supply line 421. The first developer stored in the first tank 410 may be provided to the chamber 401 through the first fluid supplier 420 at the first temperature. A development process may be performed using the first developer provided to the chamber 401.

The first source storage 430 may be connected to the first tank 410 via the first source supplier 440. The first source storage 430 may receive the first developer from outside the semiconductor device manufacturing apparatus 10, and may store the received first developer therein. The first source storage 430 may supply the first developer to the first tank 410 through the first source supplier 440. The first source supplier 440 may include a first source line 441 and a first source valve 442. The first source line 441 may interconnect the first source storage 430 and the first tank 410, and the first source valve 422 may be provided at the first source line 441. The first source valve 422 may open or close the first source line 441, thereby adjusting a flow rate of the first developer. In an embodiment, the first source storage 430 may be omitted, and the first developer may be directly supplied to the first tank 410 from outside the semiconductor device manufacturing apparatus 10.

The first source supplier 440 may further include a first branch line 443. The first source storage 430 may be connected to the second tank 450 via the first branch line 443. For example, the first branch line 443 may be branched from the first source line 440, and may be connected to the second tank 450. For example, the first branch line 443 may be connected to the first source valve 422. The first source valve 422 may be provided at a branch point where the first branch line 443 is branched from the first source line 441. The first source valve 442 may open or close each of the first source line 441 and the first branch line 443. The first source valve 442 may adjust a flow rate of the first developer for each of the first source line 441 and the first branch line 443. The first developer stored in the first source storage 430 may be provided to the second tank 450 via the first source line 441 and the first branch line 443. In an embodiment, when the first source storage 430 is omitted, the first developer may be provided to the second tank 450 via the second source line 443 from outside the semiconductor device manufacturing apparatus 10.

The second source storage 470 may be connected to the second tank 450 via the second source supplier 480. The second source storage 470 may store a process fluid. For example, the process fluid, which is stored in the second source storage 470, may be $CO_2$. The process fluid stored in the second source storage 470 may be provided to the second tank 450 through the second source supplier 480. The second source supplier 480 may include a second source line 481, a second source valve 482, and a second source filter 483. The second source line 481 may interconnect the second source storage 470 and the second tank 450, and the second source value 482 and the second source filter 483 may be provided at the second source line 481. The second source valve 482 may open or close the second source line 481, thereby adjusting a flow rate of the process fluid supplied to the second tank 450. The second source filter 483 may remove impurities from the process fluid. The internal pressure of the second source storage 470 may be maintained at a predetermined pressure. That is, the second source storage 470 may store the process fluid under a condition that the process fluid is pressurized at a predetermined pressure. For example, the predetermined pressure may be 1 to 10 bar, but the example embodiments of the disclosure are not limited thereto. The second source storage 470 may be omitted, and a gas from outside the semiconductor device manufacturing apparatus 10 may be provided to the second tank 450 through the second source supplier 480.

In an embodiment, the second tank 450 may receive the first developer from the first source storage 430, and may receive $CO_2$ from the second source storage 470. For example, the second tank 450 may receive pressurized $CO_2$ from the second source storage 470. As pressurized $CO_2$ is provided to the second tank 450, the internal pressure of the second tank 450 may increase. As $CO_2$ is pressurized into the first developer, $CO_2$ may be dissolved in the first developer, thereby producing a second developer. The first developer, in which $CO_2$ is dissolved, may be referred to as a "second developer".

The second developer may be stored in the second tank 450 at a second temperature. The second temperature may be lower than the first temperature that is the temperature of the first developer in the first tank 410. For example, the second developer may be stored in the second tank 450 at about −20 to 20° C. The internal pressure of the second tank 450 may be maintained at a predetermined pressure. For example, the internal pressure of the second tank 450 may be maintained at about 1 to 10 bar. Preferably, the internal temperature of the second tank 450 is maintained at about 3 to 10 bar. As the temperature of the second developer and the internal pressure of the second tank 450 are maintained as described above, the solubility of $CO_2$ in the first developer or the second developer may be increased in accordance with an increased amount of $CO_2$ supplied to the second tank 450.

The first low temperature device 455 may be connected to the second tank 450. The first low temperature device 455 may be a part of the second tank 450. For example, the first low temperature device 455 may be a circulation type heat exchanger or a bath heat exchanger which includes a pipe passing through the second tank 450. The internal temperature of the second tank 450 may be maintained at a predetermined temperature through the first low temperature device 455. For example, the first low temperature device 455 may maintain the temperature of the second developer in the second tank 450 at the second temperature.

The second tank 450 may be connected to the chamber 401 via the second fluid supplier 460. The second developer in the second tank 450 may be provided to the chamber 401 through the second fluid supplier 460. The second developer may be provided to the chamber 401 at the second temperature. The second fluid supplier 460 may include a second supply line 461, the second supply valve 462, and the supply filter 463. The second supply line 461 may interconnect the second tank 450 and the chamber 401, and the second supply valve 462 may open or close the second supply line 461, thereby adjusting a flow rate of the second developer. The second supply filter 463 may remove impurities from the second developer passing through the second supply line 461.

The second developer in the second tank 450 may be provided to a substrate in the chamber 401 after the first developer is provided onto the substrate, and a development process is then performed, that is, after completion of the development process. As the second developer is provided onto the substrate, the first developer of the first temperature on the substrate may be substituted by or replaced with the second developer of the second temperature. In a state in which the substrate and the photoresist pattern on the substrate are wetted by the second developer, the substrate is unloaded from the chamber 401 by the transfer robot 200, and may then be transferred to the supercritical drying device 600. The second developer may be dried in the supercritical drying device 600 using a supercritical fluid and/or a subcritical fluid.

Referring to FIG. 3, the development device 400 may further include a second low temperature device 457 connected to the first fluid supplier 420 and/or the second fluid supplier 460. The second low temperature device 457 may prevent an increase in the temperature of the first developer passing through the first fluid supplier 420 and/or may prevent an increase in the temperature of the second developer passing through the second fluid supplier 460. For example, the second low temperature device 457 may maintain the first developer passing through the first fluid supplier 420 at the first temperature and/or may maintain the second developer passing through the second fluid supplier 460 at the second temperature. As such, the first developer may be supplied to the chamber 401 through the first fluid supplier 420 at the first temperature, and the second developer may be supplied to the chamber 401 through the second fluid supplier 460 at the second temperature.

Figure 4:
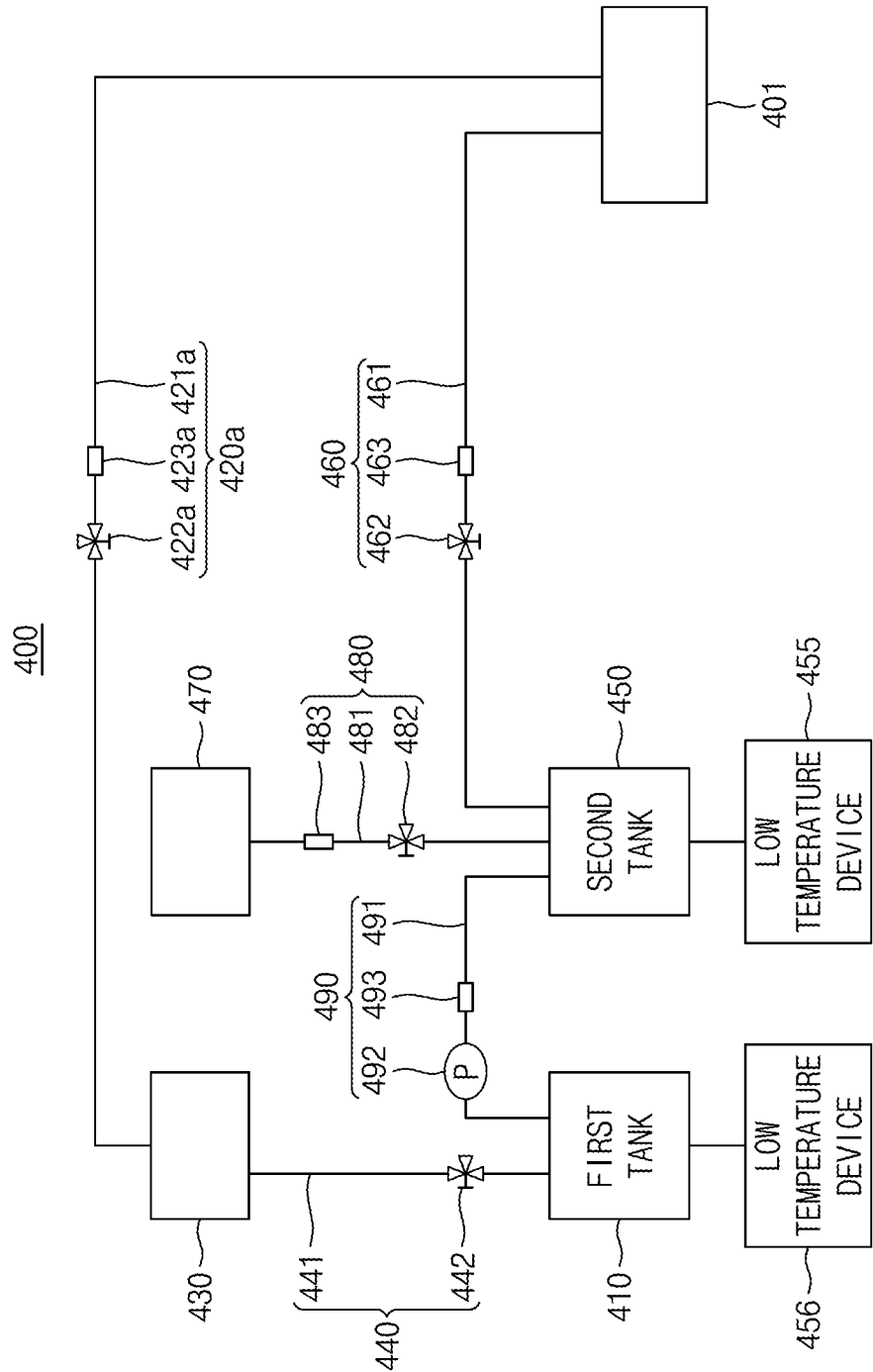
FIG. 4 is a view schematically showing a development device according to an example embodiment of the disclosure.
Figure 5:
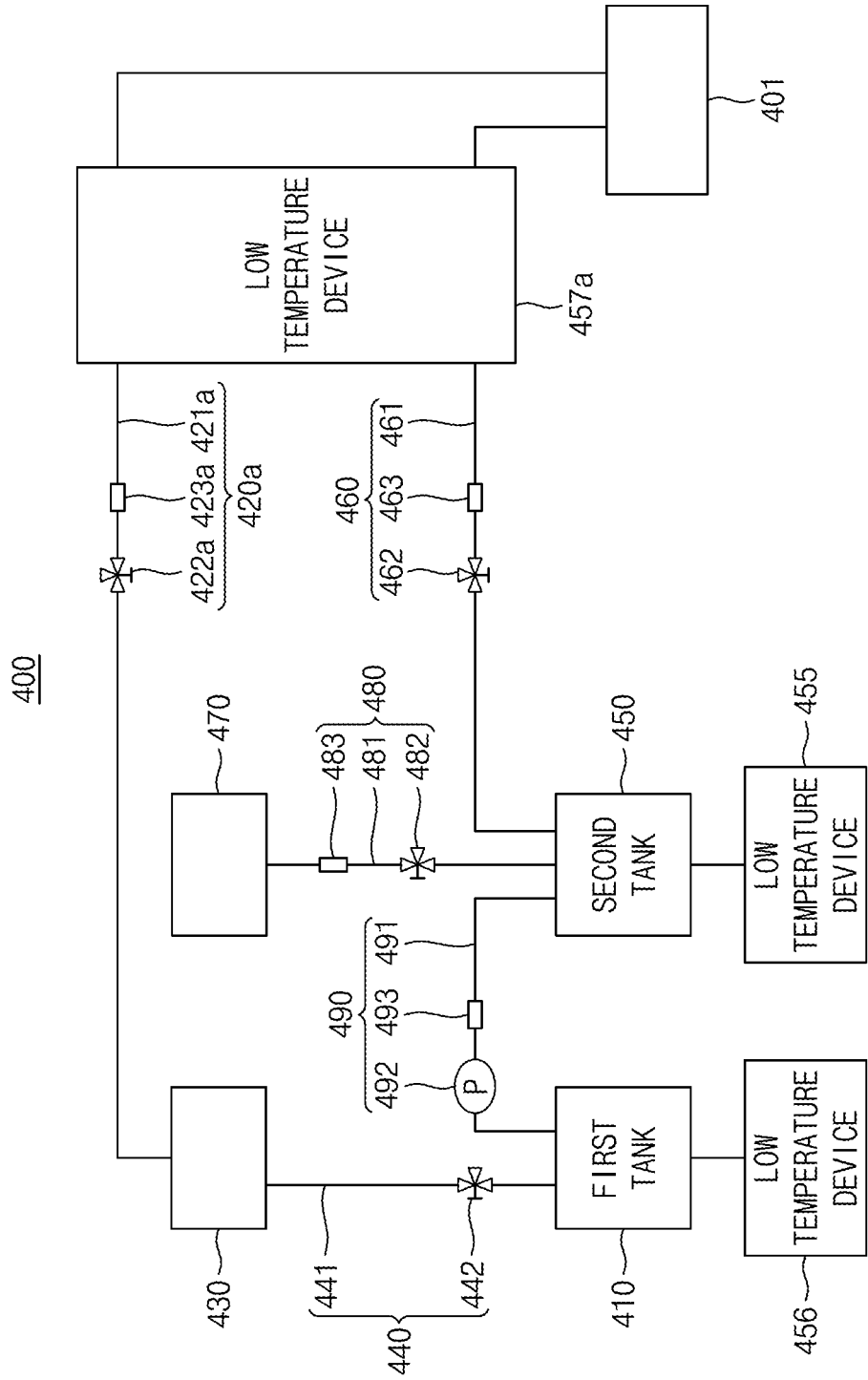
FIG. 5 is a view schematically showing a development device according to an example embodiment of the disclosure.

FIG. 4 is a view schematically showing a development device according to an example embodiment of the disclosure. FIG. 5 is a view schematically showing a development device according to an example embodiment of the disclosure. In this specification, the same reference numeral may mean the same configuration, and no description will be given of the contents overlapping with those described with reference to FIGS. 2 and 3 in the following description.

Referring to FIG. 4, a development device 400 may include a chamber 401, a first tank 410, a first source storage 430, a first source supplier 440, a first fluid supplier 420a, an intermediate supplier 490, a second tank 450, a second source storage 470, a second source supplier 480, a second fluid supplier 460, a first low temperature device 456, and a second low temperature device 455.

The first source storage 430 may be connected to the chamber 401 via the first fluid supplier 420a. A first developer stored in the first source storage 430 may be provided to the chamber 401 through the first fluid supplier 420a. The first developer in the first source storage 430 may be stored at a first temperature and, as such, may be supplied to the chamber 401 at the first temperature. For example, the first temperature may be 15 to 25° C. Of course, the example embodiments of the disclosure are not limited to the above-described condition, and the first temperature may be varied in accordance with the kind of the first developer. A development process may be performed in the chamber 401 by the first developer supplied through the first fluid supplier 420a.

The first low temperature device 456 may be connected to the first tank 410. The first low temperature device 456 may be a part of the first tank 410. The internal temperature of the first tank 410 may be maintained at a predetermined temperature through the first low temperature device 456. For example, the first low temperature device 456 may maintain the temperature of the first developer in the first tank 410 at a second temperature lower than the first temperature. For example, the second temperature may be −20 to 20° C.

The first tank 410 and the second tank 450 may be interconnected via the intermediate supplier 490. The first developer stored in the first tank 410 may be supplied to the second tank 450 through the intermediate supplier 490. The first developer may be supplied to the second tank 450 at the second temperature. As the first developer is cooled to a low temperature, and the resultant first developer in the low-temperature state is then supplied to the second tank 450, $CO_2$ may be received from the second source storage and more rapidly dissolved in the first developer in the second tank 450. The intermediate supplier 490 may include an intermediate source line 491 interconnecting the first tank 410 and the second tank 450, and a pump 492 and a filter 493 provided at the intermediate source line 491. The pump 492 may pressurize the first developer flowing in the intermediate source line 491 and, as such, may supply the pressurized first developer to the second tank 450. That is, the pump 492 may increase the flow rate of the first developer passing through the intermediate source line 491, thereby increasing the internal pressure of the second tank 450. The filter 492 may remove impurities from the first developer passing through the intermediate source line 491.

The second low temperature device 455 may be connected to the second tank 450. The second low temperature device 455 may be a part of the second tank 450. The internal temperature of the second tank 450 may be maintained at a predetermined temperature through the second low temperature device 455. For example, the second low temperature device 455 may maintain the second developer in the second tank 450 at the second temperature. In an embodiment, the second developer may be maintained at a third temperature lower than the second temperature through the second low temperature device 455.

In an embodiment, the first fluid supplier 420a may interconnect the first tank 410 and the chamber 401, differently from the shown case. As such, the first developer in the first tank 410 may be supplied to the chamber 401.

Referring to FIG. 5, the development device 400 may further include a third low temperature device 457a. The third low temperature device 457a may be connected to the first fluid supplier 420a and/or the second fluid supplier 460. The third low temperature device 457a may prevent an increase in the temperature of the first developer passing through the first fluid supplier 420a and/or may prevent an increase in the temperature of the second developer passing through the second fluid supplier 460. For example, the third low temperature device 457a may maintain the first developer passing through the first fluid supplier 420a at the first temperature and/or may maintain the second developer passing through the second fluid supplier 460 at the second temperature or the third temperature lower than the first temperature. As such, the first developer may be supplied to the chamber 401 at the first temperature, and the second developer may be supplied to the chamber 401 at the second temperature or the third temperature.

Figure 6:
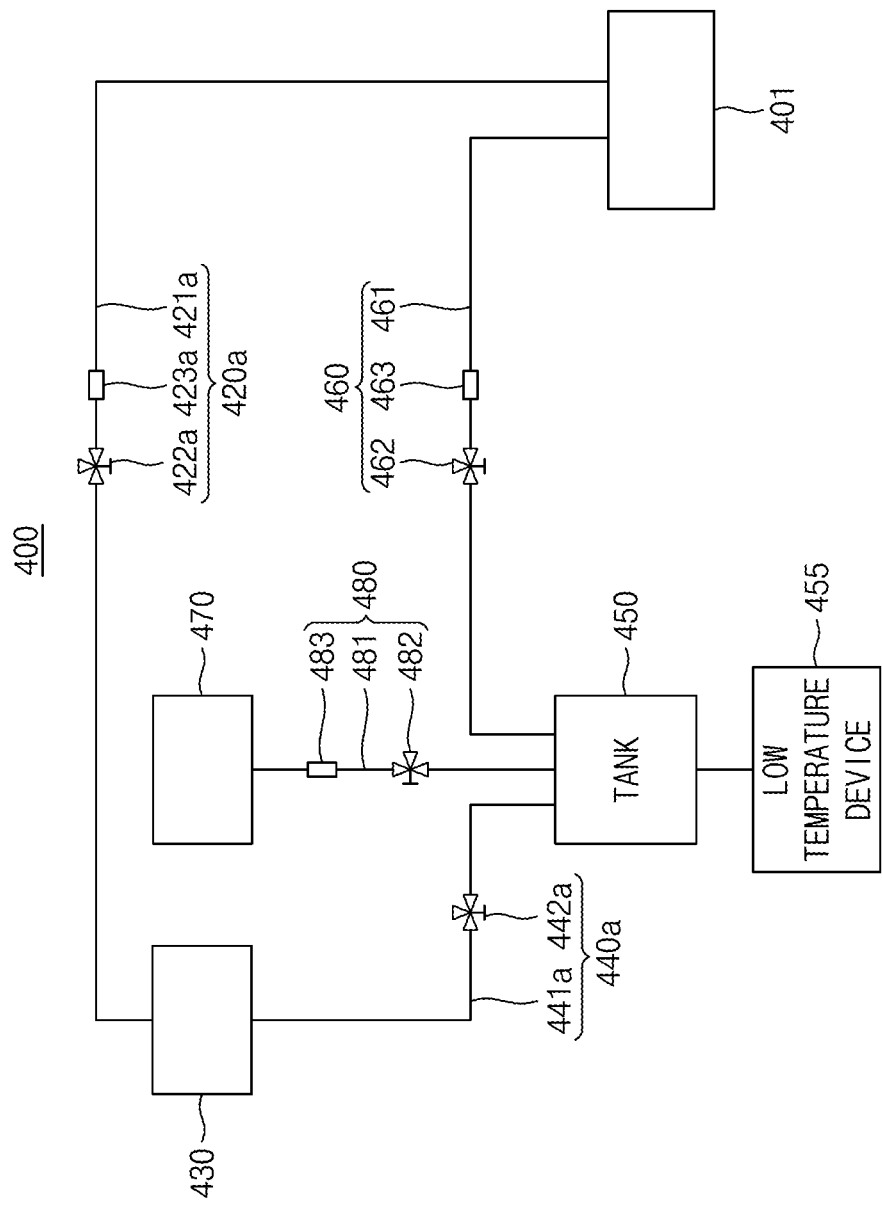
FIG. 6 is a view schematically showing a development device according to an example embodiment of the disclosure.
Figure 7:
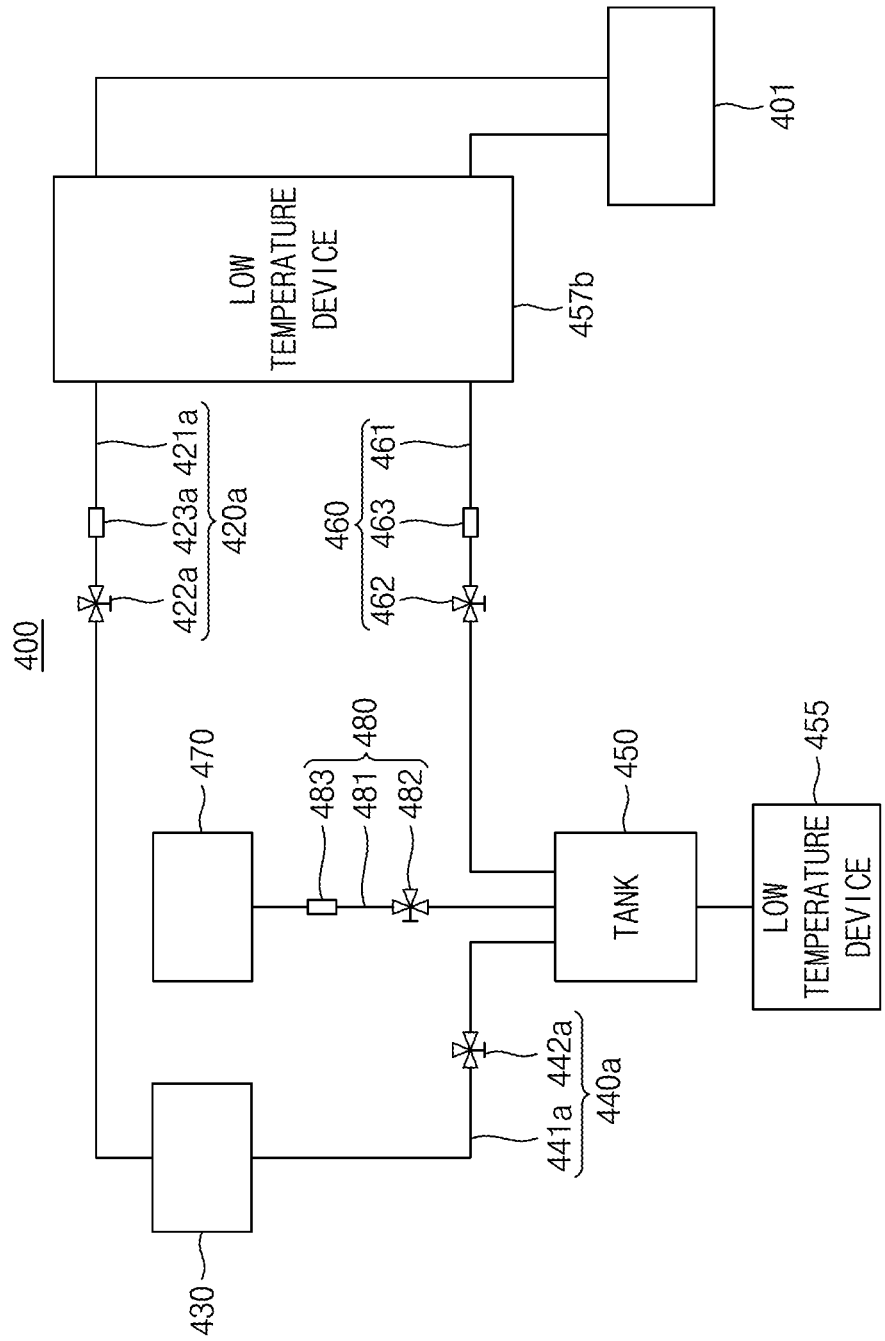
FIG. 7 is a view schematically showing a development device according to an example embodiment of the disclosure.

FIG. 6 is a view schematically showing a development device according to an example embodiment of the disclosure. FIG. 7 is a view schematically showing a development device according to an example embodiment of the disclosure.

Referring to FIG. 6, a development device 400 may include a chamber 401, a tank 450, a first source storage 430, a first fluid supplier 420a, a first source supplier 440a, a second fluid supplier 460, a second source storage 470, a second source supplier 480, and a first low temperature device 455.

The chamber 401 and the first source storage 430 may be interconnected via the first fluid supplier 420a. A first developer stored in the first source storage 430 may be provided to the chamber 401 through the first fluid supplier 420a. The first developer may be supplied to the chamber 401 at a first temperature. A development process may be performed in the chamber 401 by the first developer supplied at the first temperature.

The tank 450 and the first source storage 430 may be interconnected via the first source supplier 440a. The first source supplier 440a may include a first source line 441a interconnecting the first source storage 430 and the tank 450, and a first source valve 442a provided at the first source line 441a. The first developer stored in the first source storage 430 may be supplied to the tank 450 through the first source supplier 440a.

The tank 450 and the second source storage 470 may be interconnected via the second source supplier 480. A process fluid stored in the second source storage 470 may be supplied to the tank 450 through the second source supplier

480. For example, the process fluid stored in the second source storage 470 may be $CO_2$.

As the process fluid, that is, $CO_2$, is pressurized into the first developer in the tank 450, $CO_2$ is dissolved in the first developer and, as such, a second developer is produced. The second developer may be stored in the tank 450 at a second temperature. The second developer in the tank 450 may be supplied to the chamber 401 through the second fluid supplier 460 at the second temperature that is lower than the first temperature. The second developer may be supplied to the chamber 401 after completion of a development process by the first developer.

Referring to FIG. 7, the development device 400 may further include a second low temperature device 457b connected to the first fluid supplier 420a and/or the second fluid supplier 460. The second low temperature device 457b may prevent an increase in the temperature of the first developer passing through the first fluid supplier 420a and/or may prevent an increase in the temperature of the second developer passing through the second fluid supplier 460. For example, the second low temperature device 457b may maintain the first developer passing through the first fluid supplier 420a at the first temperature and/or may maintain the second developer passing through the second fluid supplier 460 at the second temperature. As such, the first developer may be supplied to the chamber 401 through the first fluid supplier 420a at the first temperature, and the second developer may be supplied to the chamber 401 through the second fluid supplier 460 at the second temperature.

Figure 8:
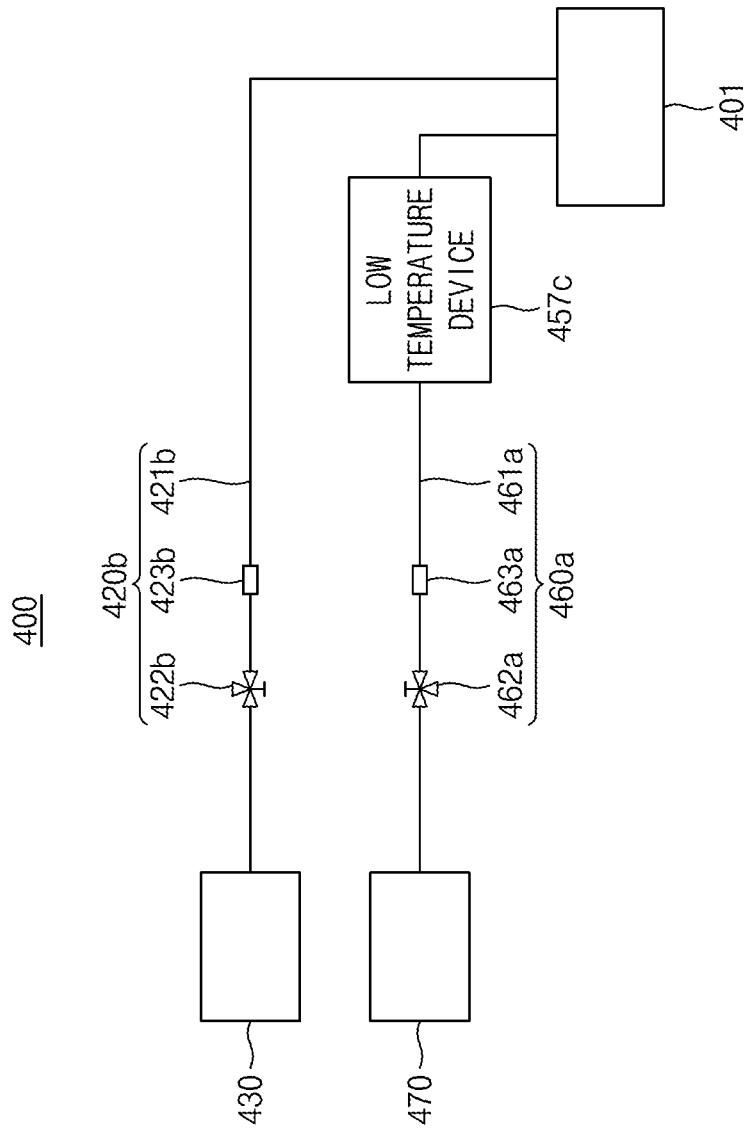
FIG. 8 is a view schematically showing a development device according to an example embodiment of the disclosure.

FIG. 8 is a view schematically showing a development device according to an example embodiment of the disclosure.

Referring to FIG. 8, a development device 400 may include a chamber 401, a first source storage 430, a first source supplier 420b, a second source storage 470, a second source supplier 460a, and a low temperature device 457c.

The chamber 401 and the first source storage 430 may be interconnected via the first source supplier 420b. The first source storage 430 may store a first developer. The first source storage 430 may store the first developer at a first temperature. For example, the first temperature may be about 15 to 25° C., without being limited thereto, and may be varied in accordance with the kind of the first developer. The first source supplier 420b may include a first source line 421b, a first source valve 422b, and a first source filter 423b. The first source line 421b may interconnect the chamber 401 and the first source storage 430, and the first source valve 422b and the first source filter 423b may be provided at the first source line 421b. The first developer at the first temperature may be provided onto a substrate in the chamber 401 through the first source supplier 420b and, as such, a development process may be performed.

The chamber 401 and the second source storage 470 may be interconnected via the second source supplier 460a. The second source storage 470 may store a process fluid. The temperature of the process fluid in the second source storage 470 may be, for example, the first temperature. Of course, the example embodiments of the disclosure are not limited to the above-described condition, and the temperature of the process fluid may be −20 to 20° C. For example, the process fluid may be $CO_2$. The second source supplier 460a may include a second source line 461a, a second source valve 462a, and a second source filter 463a. The process fluid stored in the second source storage 470 may be provided to the chamber 401 through the second source supplier 460a. The process fluid may be supplied to the chamber 401 after completion of the development process.

The low temperature device 457c may be connected to the second source supplier 460a. The low temperature device 457c may be connected to the second source line 461a. The low temperature device 457c may decrease the temperature of the process fluid supplied to the chamber 401 through the second source supplier 460a to a second temperature lower than the first temperature. For example, the second temperature may be −20 to 20° C. As such, the process fluid may be provided to the chamber 401 at the second temperature. Otherwise, the low temperature device 457c may prevent the temperature of the process fluid from increasing while the process fluid passes through the second source supplier 460a (in the case in which the process fluid has already been at a low temperature). As the process fluid of the second temperature is provided onto the substrate in the chamber 401, the process fluid may be dissolved in the first developer. After completion of the development process, a residue of the first developer may remain on the substrate and, as such, the process fluid of the second temperature may be dissolved in the residual first developer. As a result, the residual first developer may be substituted by or replaced with a second developer in which the process fluid is dissolved.

Figure 9:
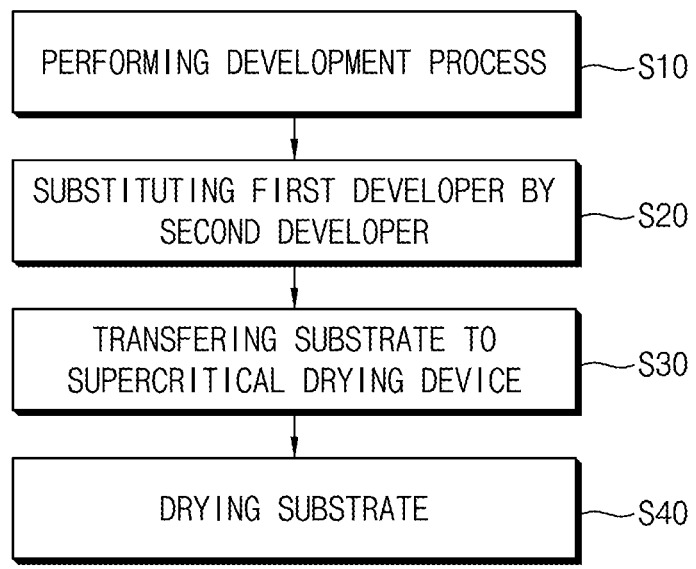
FIG. 9 is a flowchart explaining a substrate processing method according to an example embodiment of the disclosure.

FIG. 9 is a flowchart explaining a substrate processing method according to an example embodiment of the disclosure.

Referring to FIGS. 1A to 9, when a substrate is provided to a chamber 401 of a development device 400, a development process may be performed (S10). The substrate may be in a state in which a photoresist layer has been formed at the substrate in a spin coater 300, and an exposure process has been completed in a lithography device LP. A first developer is supplied onto the substrate through a first fluid supplier 420 or 420a (cf. FIGS. 2 to 7) or a first source supplier 420b (cf. FIG. 8) and, as such, a development process may be performed. The temperature of the first developer supplied onto the substrate may be a first temperature. For example, the first temperature may be ambient temperature, and may be about 15 to 25° C., but may be a temperature higher or lower than this temperature in accordance with the kind of the first developer. The first developer may include an acetate series material, an organic solvent of alcohols, an organic solvent of alkanes, or an organic solvent of ketones. For example, the first developer may include n-butyl acetate.

After completion of the development process, that is, after completion of supply of the first developer, a residue of the first developer may be substituted by or replaced with a second developer by supplying a process fluid of a second temperature lower than the first temperature onto the substrate (S20). For example, the second temperature may be −20 to 20° C. After completion of the development process, a residue of the first developer remaining after dissolving the photoresist layer may be present on the substrate. As the process fluid is supplied onto the substrate through a second fluid supplier 460 (cf. FIGS. 2 to 7) or a second source supplier 460a (cf. FIG. 8) such that the process fluid is mixed with the residual first developer, the residual first developer may be substituted by or replaced with a second developer that is a mixture of the process fluid and the residual first developer. For example, the provided process fluid may be $CO_2$ or the second developer. The second developer may be the first developer in which $CO_2$ is dissolved. The temperature of the second developer substituted on the substrate may be the second temperature.

Thereafter, the substrate in a state of being wetted by the second developer may be transferred to a supercritical drying device 600 (S30). A transfer robot 200 may unload the substrate from the chamber 401, and may then transfer the unloaded substrate to the supercritical drying device 600. In conventional cases, there is a problem in that the photoresist layer (or a photoresist pattern) is dissolved by the residual first developer while the substrate is transferred to the supercritical drying device 600. Since the temperature of the second developer is the second temperature and, as such, is lower than the temperature of the first developer, that is, the first temperature, and $CO_2$ is dissolved in the second developer, the solubility of the photoresist layer (or the photoresist pattern) in the second developer may be lower than in the first developer. Accordingly, in the example embodiments of the disclosure, it may be possible to prevent the photoresist layer (or the photoresist pattern) from being damaged by the residual first developer during transfer of the substrate from the development device 400 to the supercritical drying device 600 by replacing the residual developer with the second developer after completion of the development process.

The supercritical drying device 600 may supply a supercritical fluid and/or a subcritical fluid onto the substrate, thereby drying the second developer (S40). In an embodiment, the substrate may be transferred from the supercritical drying device 600 to a baking device 500 after completion of the drying process, and a hard bake process may be performed in the baking device 500.

Figure 10:
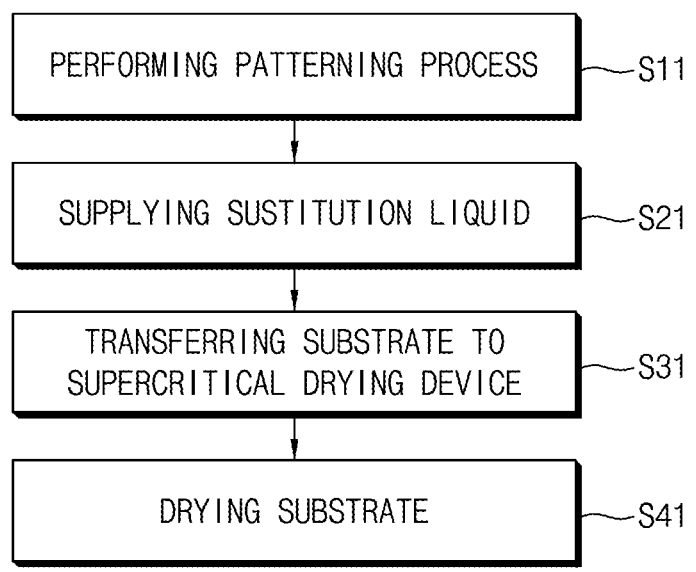
FIG. 10 is a flowchart explaining a substrate processing method according to an example embodiment of the disclosure.

FIG. 10 is a flowchart explaining a substrate processing method according to an example embodiment of the disclosure.

Referring to FIG. 10, a patterning process for forming a pattern on a substrate may be performed in an etching device (S11). For example, the substrate or an inorganic layer on the substrate may be etched through an etching process using a hard mask pattern as an etch mask and, as such, an inorganic pattern may be formed. The etching process may be performed using an etchant. For example, the etchant may be provided onto the substrate at a first temperature. For example, the first temperature may be 100 to 300° C., without being limited thereto.

After completion of the patterning process, a replacement or substitution liquid may be supplied onto the substrate (S21). As the substitution liquid is supplied, the etchant may be substituted by the substitution liquid. In an embodiment, the substitution liquid may be supplied after the substrate is cleaned by a cleaning liquid such as deionized water after completion of the patterning process. For example, the substitution liquid may include a solution of alcohols in which $CO_2$ is dissolved. For example, the substitution liquid may include isopropyl alcohol (IPA) in which $CO_2$ is dissolved. The substitution liquid may be provided at a second temperature lower than the first temperature. For example, the second temperature may be −20 to 20° C., without being limited thereto. The substitution liquid may be produced through a device identical or similar to the tank and the low temperature device forming a second developer, which are described with reference to FIGS. 2 to 8. For example, isopropyl alcohol and pressurized $CO_2$ may be supplied to a tank maintained at a low temperature under a high pressure and, as such, $CO_2$ may be dissolved in isopropyl alcohol, thereby producing a substitution liquid. Thereafter, the substitution liquid is supplied from the tank to a substrate in a chamber and, as such, the substrate may be wetted by the substitution liquid.

Thereafter, the substrate is transferred from the etching device to a supercritical drying device (S31), and the substitution liquid may be dried in the supercritical drying device (S41).

Figure 11:
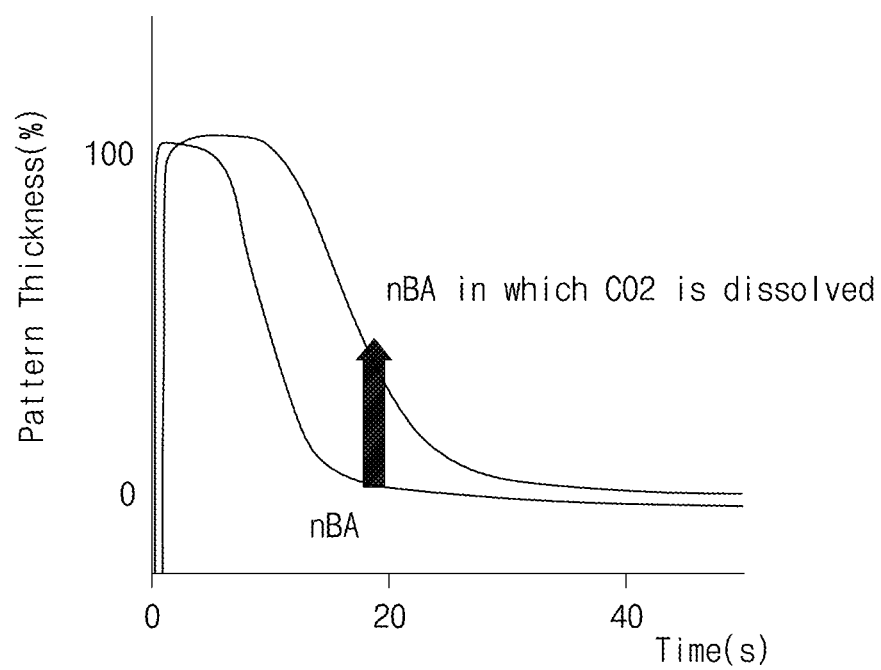
FIGS. 11 to 13 are graphs explaining effects of a substrate processing method according to an example embodiment of the disclosure.
Figure 12:
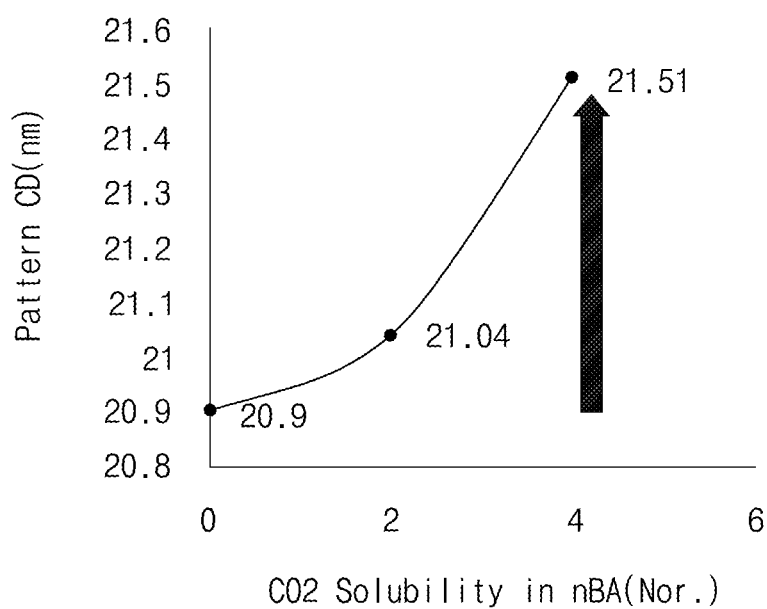
Figure 13:
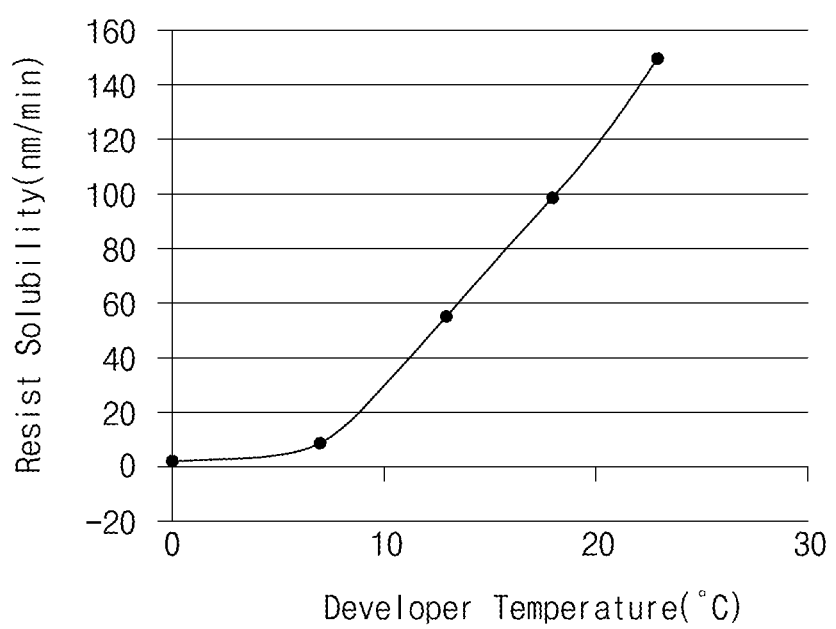

FIGS. 11 to 13 are graphs explaining effects of a substrate processing method according to an example embodiment of the disclosure.

FIG. 11 depicts a graph comparing thicknesses of photoresist patterns when a substrate is transferred in a state of being wetted by a developer (for example, n-butyl acetate (nBA)) and when a substrate is transferred in a state of being wetted by a developer in which $CO_2$ is dissolved. Referring to FIG. 11, it can be seen that the photoresist pattern has a greater thickness when the substrate is transferred within 25 seconds in a state of being wetted by the developer in which $CO_2$ is dissolved. That is, it can be seen that the photoresist pattern exhibits low solubility in the developer in which $CO_2$ is dissolved.

FIG. 12 is a graph depicting a critical dimension (CD) of a photoresist pattern according to solubility of $CO_2$ in a developer (for example, n-butyl acetate (nBA)) wetting a substrate. Referring to FIG. 12, it can be seen that the CD of the photoresist pattern may be increased as the solubility of $CO_2$ in the developer increases.

FIG. 13 is a graph depicting the solubility of a photoresist in a developer according to the temperature of the developer. Referring to FIG. 13, it can be seen that the solubility of the photoresist in the developer is decreased as the temperature of the developer decreases.

In accordance with the example embodiments of the disclosure, a first developer is substituted by or replaced with a second developer of a low temperature in which a process fluid is dissolved, after execution of a development process. Since a photoresist pattern on a substrate is in a state of being wetted by the second developer other than the first developer while the substrate is transferred from a development device to a supercritical drying device, dissolution of the photoresist pattern may be minimized.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device manufacturing apparatus comprising:
   a development device configured to perform a development process for an exposed photoresist layer on a substrate;
   a supercritical drying device configured to dry the substrate using at least one of a supercritical fluid and a subcritical fluid; and
   a transfer robot configured to transfer the substrate from the development device to the supercritical drying device,
   wherein the development device comprises:
      a chamber configured to receive the substrate;
      a first tank configured to store at least a portion of a first developer provided from a first source storage, at a first temperature;
      a second tank configured to store a second developer in which pressurized CO2 provided from a second source storage is dissolved in a portion of the first developer provided from the first source storage, at a second temperature lower than the first temperature;
a first fluid supplier interconnecting the first tank and the chamber; and
a second fluid supplier interconnecting the second tank and the chamber.

2. The semiconductor device manufacturing apparatus according to claim 1, further comprising:
a first low temperature device connected to the second tank.

3. The semiconductor device manufacturing apparatus according to claim 2, further comprising:
a second low temperature device connected to the second fluid supplier.

4. The semiconductor device manufacturing apparatus according to claim 3, wherein the first fluid supplier is configured to provide the first developer in the first tank onto the substrate in the chamber at the first temperature, thereby causing the development process to be performed.

5. The semiconductor device manufacturing apparatus according to claim 4, wherein the second fluid supplier is configured to provide the second developer in the second tank onto the substrate at the second temperature after the development process, thereby causing the first developer to be replaced with the second developer.

6. The semiconductor device manufacturing apparatus according to claim 1, wherein:
the first developer is n-butyl acetate; and
the second developer is n-butyl acetate in which $CO_2$ is dissolved.

7. The semiconductor device manufacturing apparatus according to claim 1, wherein the development device further comprises:
a first source supplier configured to supply the first developer in the first source storage to the first tank and the second tank; and
a second source supplier configured to supply the pressurized $CO_2$ in the second source storage to the second tank to thereby provide the second developer.

8. A semiconductor device manufacturing apparatus comprising:
a development device to perform a development process for an exposed photoresist layer on a substrate;
a supercritical drying device configured to dry the substrate through supply of at least one of a supercritical fluid and a subcritical fluid; and
a transfer robot configured to transfer the substrate from the development device to the supercritical drying device,
wherein the development device comprises:
a chamber configured to receive the substrate;
a first source storage configured to store a first developer;
a second source storage configured to store pressurized $CO_2$;
a first tank configured to store the first developer at a first temperature;
a second tank configured to store a second developer at a second temperature;
a first source supplier interconnecting the first source storage and the first tank and supplying the first developer to the first tank;
a second source supplier interconnecting the second source storage and the second tank and supplying the pressurized $CO_2$ to the second tank;
an intermediate supplier interconnecting the first tank and the second tank and supplying the first developer to the second tank, wherein the second developer is derived from the first developer and the pressurized $CO_2$; and
a fluid supplier interconnecting the second tank and the chamber and supplying the second developer to the chamber.

9. The semiconductor device manufacturing apparatus according to claim 8, wherein the development device further comprises:
a first fluid supplier interconnecting the first source storage and the chamber and supplying the first developer to the chamber, wherein the fluid supplier interconnecting the second tank and the chamber and configured to supply the second developer to the chamber comprises a second fluid supplier.

10. The semiconductor device manufacturing apparatus according to claim 8, wherein the development device further comprises:
a first low temperature device connected to the first tank; and
a second low temperature device connected to the second tank.

11. The semiconductor device manufacturing apparatus according to claim 8, wherein the second temperature is lower than the first temperature.

12. The semiconductor device manufacturing apparatus according to claim 8, wherein the intermediate supplier comprises a pump and an intermediate source line, and the pump is configured to pressurize the first developer flowing in the intermediate source line to the second tank.

* * * * *